United States Patent [19]

Tadao

[11] Patent Number: 4,686,386

[45] Date of Patent: Aug. 11, 1987

[54] POWER-DOWN CIRCUITS FOR DYNAMIC MOS INTEGRATED CIRCUITS

[75] Inventor: Takahashi Tadao, Tokyo, Japan

[73] Assignee: Oki Electric Industry Co., Ltd., Tokyo, Japan

[21] Appl. No.: 712,753

[22] Filed: Mar. 18, 1985

[30] Foreign Application Priority Data

Mar. 21, 1984 [JP] Japan ................................. 59-52372

[51] Int. Cl.$^4$ ........................... G06F 1/04; H03K 5/13
[52] U.S. Cl. ................................. 307/269; 307/296 R; 307/480; 307/453; 365/227; 365/228; 328/72
[58] Field of Search ............... 307/480, 481, 452, 453, 307/269, 242, 244, 297, 296 R; 328/104, 63, 72; 365/227, 228; 340/825.04

[56] References Cited

U.S. PATENT DOCUMENTS 4,137,563 1/1979 Tsunoda ............................. 364/200
4,293,927 10/1981 Hoshii ................................. 364/900
4,317,180 2/1982 Lies ..................................... 364/707

Primary Examiner—Stanley D. Miller
Assistant Examiner—Richard Roseen
Attorney, Agent, or Firm—Wenderoth, Lind & Ponack

[57] ABSTRACT

A power-down circuit for saving operational power dissipation of a dynamic MOS integrated circuit during idling conditions. A clock divider generates a divided clock signal in response to an internal clock signal inputted thereto. The divided signal is synchronized with the internal clock signal and has a repetition rate which is slower than that of the internal clock signal. A control circuit delivers the control signal when a triggering signal is inputted thereto. A clock selecting circuit transfers either the internal clock signal or the divided clock signal to the dynamic MOS integrated circuit in response to the control signal.

3 Claims, 5 Drawing Figures

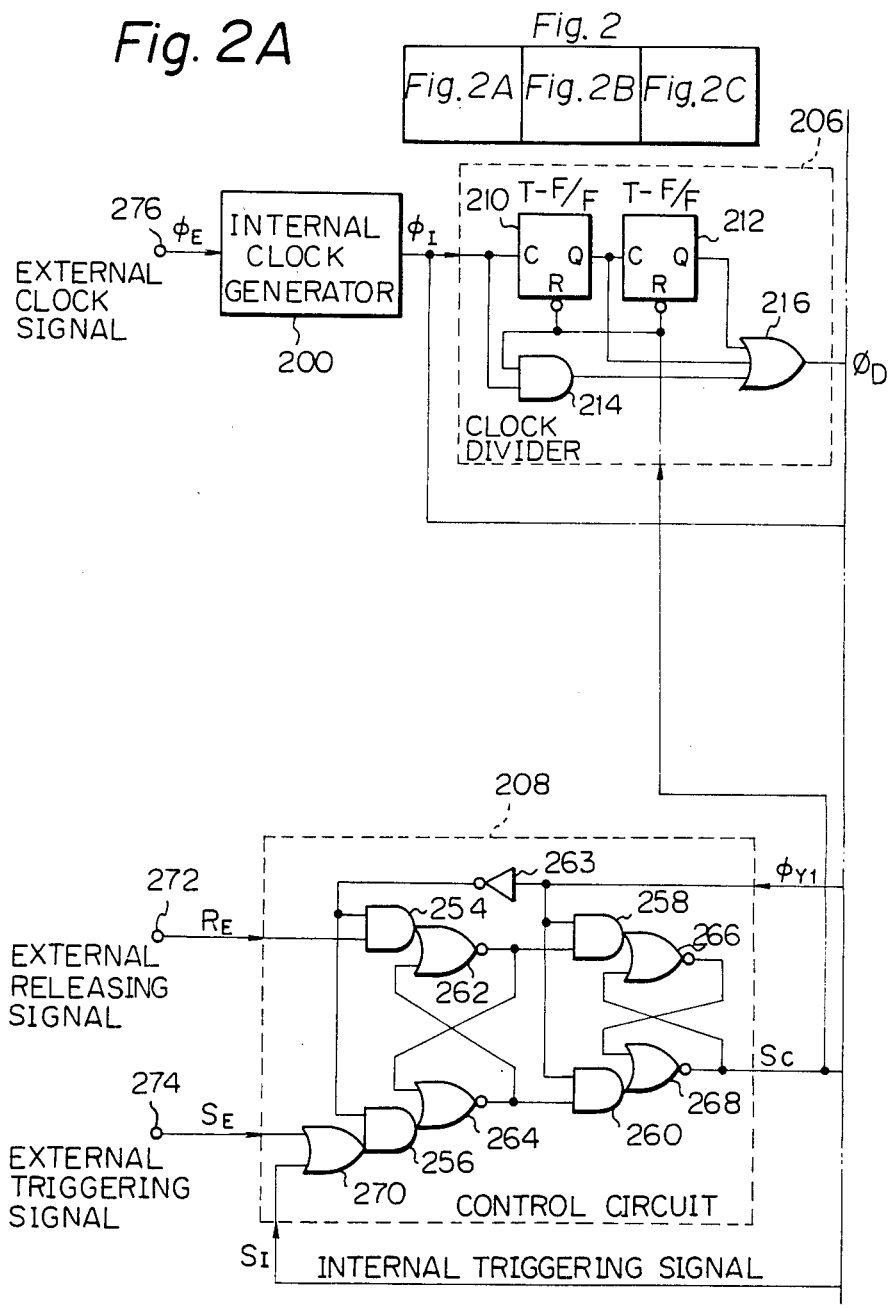

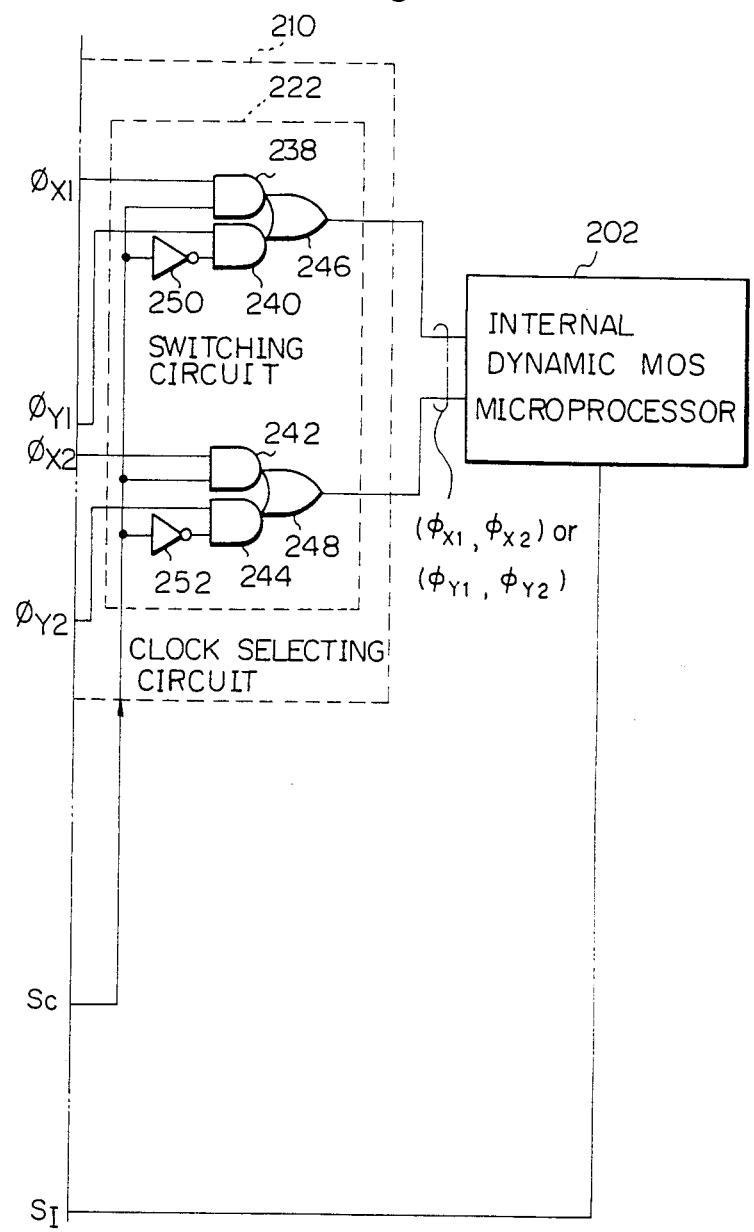

POWER-DOWN CIRCUITS FOR DYNAMIC MOS INTEGRATED CIRCUITS

BACKGROUND OF THE INVENTION

This invention relates to a power-down circuit for dynamic MOS integrated circuits.

Dynamic or clocked circuits have been widely used in MOS integrated circuits. The chief advantages of dynamic logic are as follows: (1) The flip-flop can be formed with fewer MOS devices. (2) System timing problems are simplified. (3) Less chip area is required per logic function, resulting in a lower cost of per function. (4) Since power is dissipated only when the load device is on, the power consumption is lower.

In case a MOS integrated circuit is powered with a battery, the use of a power-down circuit is useful to prolong the life of the battery. In static MOS logic integrated circuits, power saving can be easily realized by ceasing clock signals during idling conditions without destroying data stored therein. However, in the dynamic MOS logic integrated circuits, if clock signals are stopped during idling conditions, all the functions will cease, resulting in a loss of stored information. For this reason, it has been difficult to operate dynamic MOS integrated circuit in a power-down mode without occurring a loss of stored data.

SUMMARY OF THE INVENTION

It is therefore an object of the present invention to provide an improved power-down circuit for saving power consumption of a dynamic MOS integrated circuit.

It is another object of the present invention to provide a power-down circuit for dynamic MOS microprocessor integrated circuits.

The present invention provides a power-down circuit for reducing the operational power consumption of a dynamic MOS integrated circuit during idling conditions and comprising: a clock divider for generating a divided clock signal in response to an internal clock signal inputted thereto while receiving a control signal; the divided clock signal is synchronized with the internal clock signal and has a repetition rate which is slower than that of the internal clock signal; a control circuit for delivering the control signal when a triggering signal is inputted thereto; and a clock selecting circuit for transferring either the internal clock signal or the divided clock signal to the dynamic MOS integrated circuit in response to the control signal.

The present invention also provides a power-down circuit for reducing the operational power consumption of a dynamic MOS integrated circuit during idling conditions and comprising: a clock divider for generating a divided clock signal in response to an internal clock signal inputted thereto while receiving a control signal; the divided clock signal is synchronized with the internal clock signal and has a repetition rate which is slower than that of the internal clock signal; a control circuit for delivering the control signal when a triggering signal is inputted thereto; and a clock selecting circuit for converting the divided clock signal into a first pair of clock signals and the internal clock signal into a second pair of clock signals, and for selectively delivering to the dynamic MOS integrated circuit either the first pair of clock signals or the second pair of clock signals in response to the control signal, the first pair of clock signals being nonoverlapping with respect to each other, the second pair of clock signals being nonoverlapping with respect to each other.

The above and other objects, features and advantages of the present invention will become more apparent from the following description when taken in conjunction with the accompanying drawings in which a preferred embodiment of the present invention is shown by way of illustrative example.

DETAILED DESCRIPTION

Figure 1:
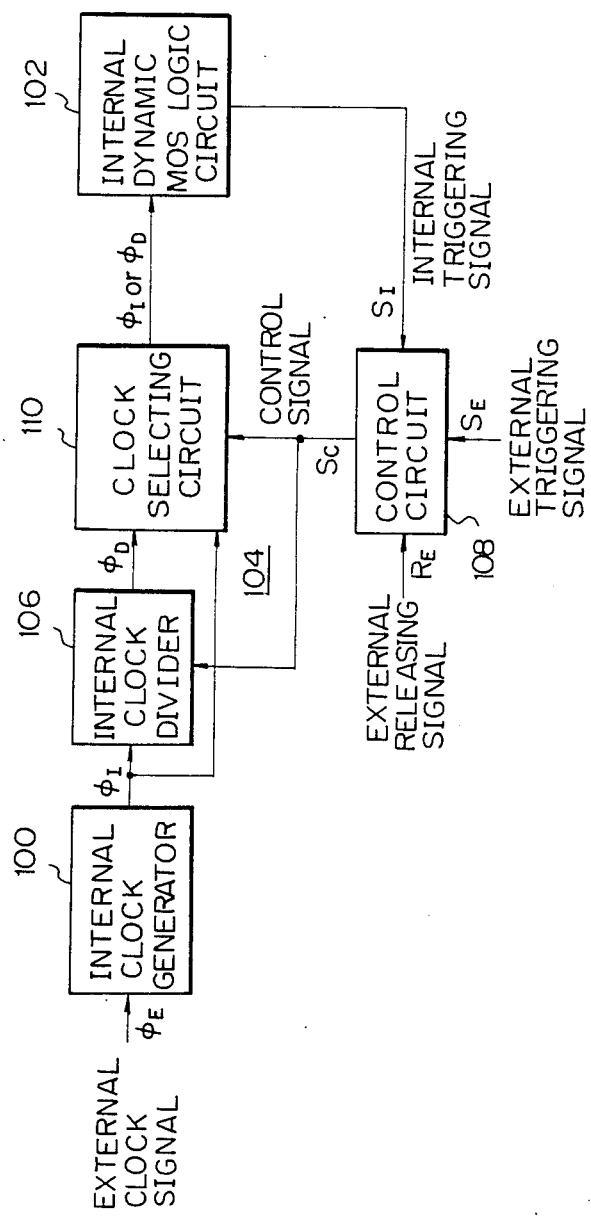
FIG. 1 is a basic block diagram of a power-down circuit according to this invention used with a dynamic MOS logic circuit.

FIG. 1 shows a MOS integrated circuit which has a basic power-down circuit according to this invention. In FIG. 1, the MOS integrated circuit includes an internal clock generator 100 for generating internal clock signals ($\phi_I$) in response to an external clock signal ($\phi_E$), an internal dynamic MOS logic circuit 102 for executing instructions, and a power-down circuit 104 for reducing the power consumption of the internal logic circuit 102. The power-down circuit 104 includes an internal clock divider 106 for dividing internal clock signals ($\phi_I$) by 1/N, a control circuit 108 for generating a control signal ($S_C$) in response to an internal triggering signal ($S_I$) or an external triggering signal ($S_E$), and a clock selecting circuit 110 for selectively transferring either the clock signal ($\phi_I$) or the divided clock signal ($\phi_D$) to the dynamic logic circuit 102.

During normal operation, since the internal dynamic logic circuit 102 does not output an internal triggering signal ($S_I$), the control circuit 108 does not send any control signal ($S_c$) to the clock divider 106 and to the clock selecting circuit 110. In this case, the clock selecting circuit 110 directly delivers the internal clock signal ($\phi_I$) from the clock generator 100, so that the dynamic circuit 102 performs a normal logic operation.

During an idle condition, the logic circuit 102 outputs the triggering signal ($S_I$). As a result, the control circuit 108 ouputs the control signal ($S_C$) both to the clock divider 106 and to the clock selecting circuit 110. Then, the clock divider 106 starts its clock pulse counting operation to output divided clock signals ($\phi_D$). The clock selecting circuit 110 transfers the divided clock signal ($\phi_D$) to the logic circuit 102, while it stops the internal clock signal ($\phi_I$) from passing therethrough. The logic circuit 102 is operated with the divided clock signal ($\phi_D$) during the idling conditions thereof.

As described above, since the MOS logic circuit 102 operates with a clock signal having a repetition rate which is slower than that of the internal clock signal ($\phi_D$), the operational power dissipation can be reduced to a fraction of that needed during normal operation.

Figure 2B:
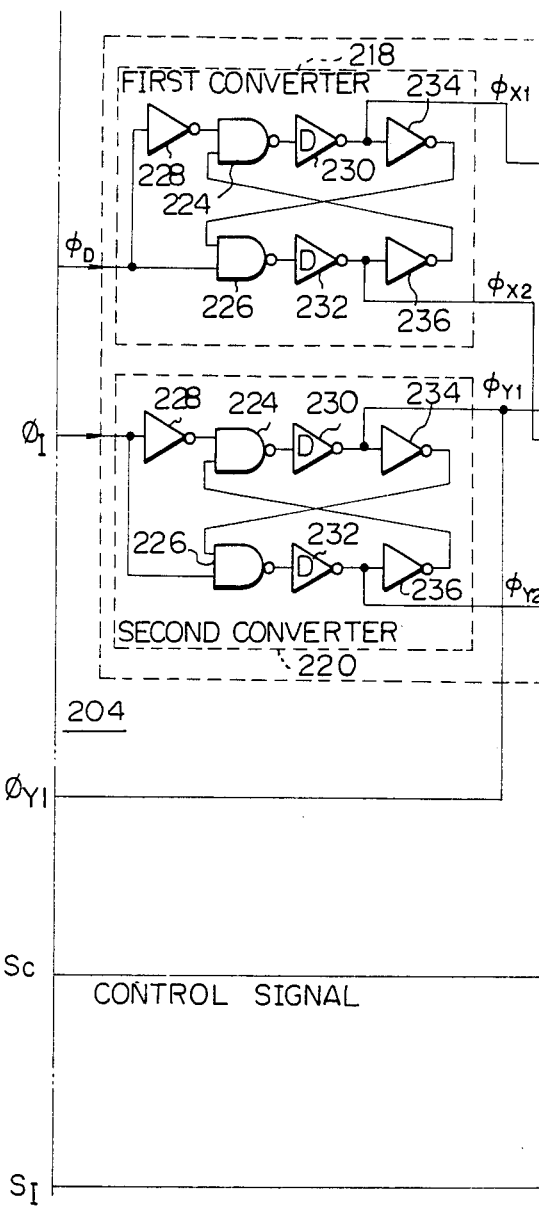
FIG. 2 is a circuit diagram of a power-down circuit according to this invention used with a dynamic MOS microprocessor.

FIG. 2 shows a MOS dynamic microprocessor having a power-down circuit according to this invention.

In FIG. 2, the MOS dynamic microprocessor includes an internal clock generator 200 which generates internal clock signals ($\phi_I$) when an external clock signal ($\phi_E$) is inputted to terminal 276, an internal microprocessor 202 which executes instructions, and a power-down circuit 204 which reduces the power dissipation of the internal microprocessor 202. The power-down circuit 204 includes an internal clock divider 206 which divides internal clock signals ($\phi_I$) to generate a divided clock signal ($\phi_D$) while a control signal ($S_C$) is inputted thereto, a control circuit 208 which generates a control signal ($S_C$) in response to an internal triggering signal ($S_I$) or an external triggering signal ($S_E$), and a clock selecting circuit 210 which converts either the divided clock signal ($\phi_D$) into a first pair of clock signals ($\phi x1, \phi x2$) or the internal clock signal ($\phi_I$) into a second pair of clock signals ($\phi y1, \phi y2$), and which selectively transfers to the microprocessor 202 either the first pair of clock signals ($\phi x1, \phi x2$) or the second pair of clock signals ($\phi y1, \phi y2$) in response to the control signal ($S_C$).

The external clock signal ($\phi_E$) from a crystal oscillator (not shown), for example, is applied to the terminal 276.

The clock divider 206 for example, functions as a divide-by-4 counter, and comprises T-type flip-flops 210 and 212, an AND logic circuit 214, and an NOR logic circuit 216. The T-type flip-flop 210 has a clock terminal C for receiving the internal clock signal ($\phi_I$) and a reset terminal R for receiving the control signal ($S_C$). The NOR logic circuit 216 outputs the divided clock signal ($\phi_D$).

The clock selecting circuit 210 comprises a first converter 218 which converts the divided clock signal ($\phi_D$) into the first pair of clock signals ($\phi x1, \phi x2$), a second converter 220 which converts the internal clock signal ($\phi_I$) into the second pair of clock signals ($\phi y1, \phi y2$), and a switching circuit 222 which selectively transfers either the first pair of clock signals ($\phi x1, \phi x2$) or the second pair of clock signals ($\phi y1, \phi y2$) to the microprocessor 202 in response to the control signal ($S_C$). The first and second converters 218 and 220 are formed of NAND logic circuits 224 and 226 and inverters 228, 230, 232, 234 and 236, respectively. The inverters 230 and 232 have time delay characteristics. The switching circuit 222 is formed of AND logic circuits 238, 240, 242 and 244, OR logic circuits 246 and 248, and inverters 250 and 252, respectively. Each of the converters 218 and 220 produces two clock signals which do no simultaneously have a "high level" so as to prevent overlapping conditions.

The control circuit 208 comprises NOR logic circuits 262, 264, 266 and 268, AND logic circuits 254, 256, 258 and 260, an inverter 263, and an OR logic circuit 270. The NOR logic circuit 268 delivers the control signal ($S_C$) to the clock divider 206 and to the switching circuit 210. The OR logic circuit 270 receives a triggering signal ($S_I$) from the microprocessor 202. A triggering signal ($S_E$) may also be externally inputted by way of a terminal 274. The clock signal ($\phi y1$) from the second converter 220 is sent to the control circuit 208 to synchronize a releasing signal ($R_E$) or the triggering signal ($S_I$) with the clock signal ($\phi_I$). The releasing signal ($R_E$) is received by the control circuit 208 to release an idling condition of the microprocessor 202 under the power-down mode.

Next, the operation of the power-down circuit according to this invention will be described in reference to FIG. 3.

In operation, an external clock signal ($\phi_E$) is applied to the terminal 276, and the terminals 272 and 274 are at an "L" level, respectively. In a normal condition, since the internal triggering signal ($S_I$) is at an "L" level, the control circuit 208 does not deliver the control signal ($S_C$), so that the clock divider 206 ceases its dividing operation, while the switching circuit 222 selects the second converter 220. The second converter 220 receives the internal clock signal ($\phi_I$) from the clock generator 200 to deliver the second pair of clock signals ($\phi y1, \phi y2$) to the switching circuit 222, as shown in FIG. 3. These signals ($\phi y1, \phi y2$) are sent as two-phase clock signals to the microprocessor 202 by way of the switching circuit 222, as shown in FIG. 3 (F). Therefore, the microprocessor 202 operates in accordance with the pair of clock signals ($\phi y1, \phi y2$).

In a power-down mode

Figure 3:
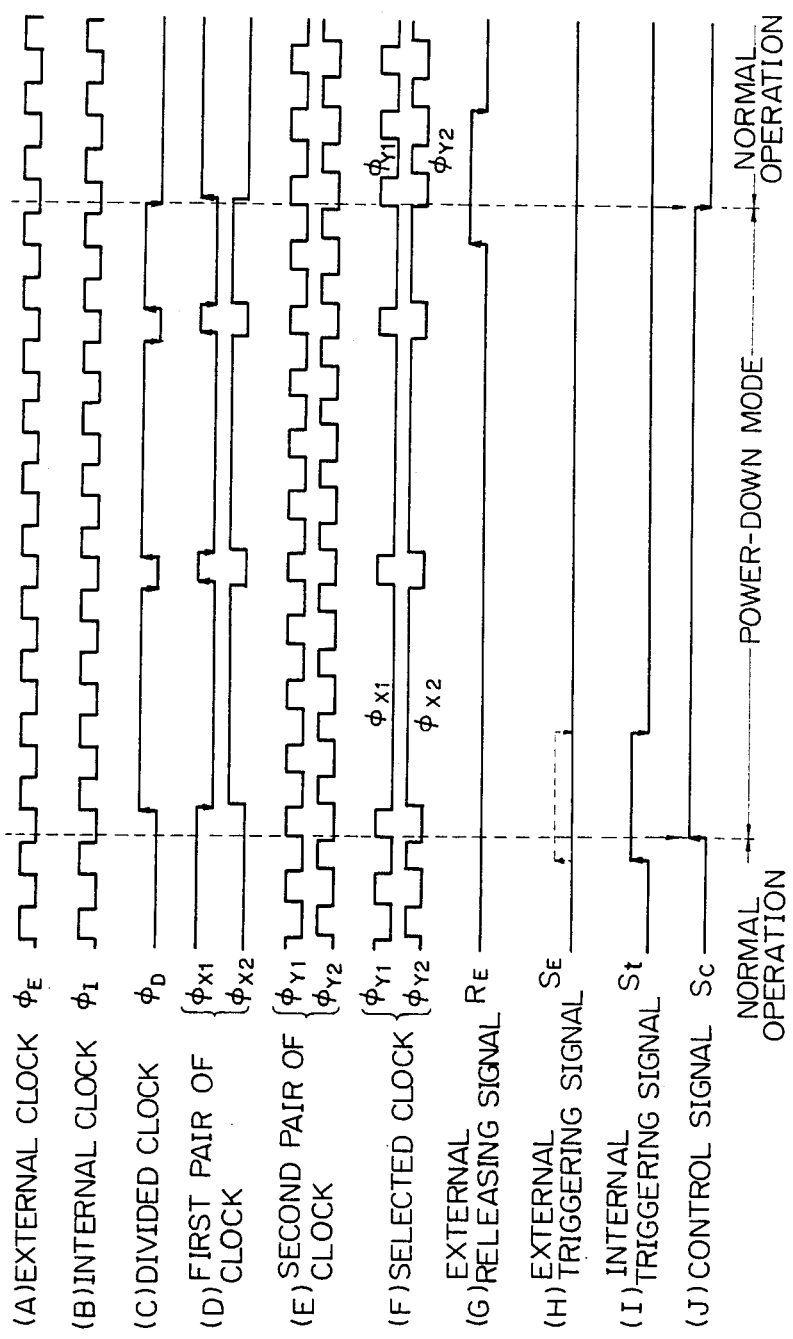
FIG. 3 shows timing signals at various nodes of the power-down circuit of FIG. 2.

For example, when the microprocessor 202 executes a completion of a "HOLD" instruction, it delivers an internal triggering signal ($S_I$), as shown in FIG. 3 (I). The triggering signal ($S_I$) is applied to the control circuit 208 in synchronization with the second clock signal ($\phi y1$). The control circuit 208 outputs a control signal ($S_C$) of an "H" level, so that the clock divider 206 starts its counting operation of the clock signal ($\phi I$), while the switching circuit 222 selects the first converter 218. Therefore, the switching circuit 222 delivers to the microprocessor 202 two clock signals ($\phi x1, \phi x2$), each having a repetition rate which is slower than that of the internal clock signal ($\phi_I$). As a result, the power dissipation of the microprocessor 202 is decreased to one fourth of that of normal operation during its power-down state.

Next, in order to return to the normal condition, an external releasing signal ($S_E$) is applied to the terminal 272 as shown in FIG. 3 (H). Then, the output of the control circuit 208 becomes an "L" logic level in synchronization with the clock signal ($\phi y1$), as shown in FIG. 3 (J). The clock divider 206 ceases the pulse counting operation, while the switching circuit 222 delivers the signals ($\phi y1, \phi y2$) to the microprocessor 202.

The power-down mode may be realized by externally applying an external triggering signal ($S_E$) to the terminal 274, as shown FIG. 3 (H). The frequency of the divided clock signal ($\phi_D$) should be decreased to a value that the dynamic MOS logic circuit can hold information in clock (refresh) operations to save power consumption.

As described above, the power-down circuit according to this invention can carry out a power-down mode without destroying stored information and without losing the advantages of the dynamic MOS logic circuit.

What is claimed is:

1. A power-down circuit for reducing operational power consumption of a dynamic MOS integrated circuit during idling conditions, said power-down circuit comprising:

a clock divider for generating a divided clock signal in response to an internal clock signal inputted thereto while receiving a control signal, said divided clock signal being synchronized with said internal clock signal and having a repetition rate which is slower than that of said internal clock signal;

a control circuit for delivering said control signal when a triggering signal from said dynamic MOS integrated circuit or from an external triggering signal source is inputted thereto; and a clock selecting circuit having a first input for receiving said divided clock signal, a second input for receiving said internal clock signal, a third input for receiving said control signal, and an output coupled to said dynamic MOS integrated circuit, for converting said divided clock signal into a first pair of clock signals and for converting said internal clock signal into a second pair of clock signals, and for selectively transferring to said dynamic MOS integrated circuit either said first pair of clock signals or said second pair of clock signals in response to said control signal, said first pair of clock signals being nonoverlapping with respect to each other and said second pair of clock signals being nonoverlapping with respect to each other.

2. A circuit according to claim 1, wherein said selecting circuit comprises a first converter for converting said divided clock signal into said first pair of clock signals, a second converter for converting said internal clock signal into said second pair of clock signals, a switching circuit for selectively transferring either said first pair of clock signals or said second pair of clock signals to said MOS integrated circuit in response to said control signal.

3. A circuit according to claim 2, wherein said dynamic MOS integrated circuit delivers said triggering signal in response to execution of instructions by said dynamic MOS integrated circuit.

* * * * *